United States Patent [19]

Hanak et al.

[11] Patent Number: 4,532,371
[45] Date of Patent: Jul. 30, 1985

[54] SERIES-CONNECTED PHOTOVOLTAIC ARRAY AND METHOD OF MAKING SAME

[75] Inventors: Joseph J. Hanak, Lawrenceville; Gerald E. Nostrand, Plainsboro, both of N.J.

[73] Assignee: RCA Corporation, Princeton, N.J.

[21] Appl. No.: 588,331

[22] Filed: Mar. 12, 1984

[30] Foreign Application Priority Data

Nov. 16, 1983 [GB] United Kingdom ............... 8330578

[51] Int. Cl.³ .................. H01L 31/06; H01L 31/18
[52] U.S. Cl. .................................. 136/249; 136/258; 29/572; 357/30
[58] Field of Search ........ 136/244, 249 MS, 258 AM; 29/572; 357/30

[56] References Cited

U.S. PATENT DOCUMENTS

| 4,042,418 | 8/1977 | Biter | 136/249 MS |
|---|---|---|---|
| 4,064,521 | 12/1977 | Carlson | 357/2 |
| 4,105,471 | 8/1978 | Yerkes et al. | 136/256 |
| 4,243,432 | 1/1981 | Jordan et al. | 136/244 |
| 4,290,844 | 9/1981 | Rotolante et al. | 156/630 |
| 4,292,092 | 9/1981 | Hanak | 148/1.5 |
| 4,315,096 | 2/1982 | Tyan et al. | 136/244 |
| 4,316,049 | 2/1982 | Hanak | 136/244 |
| 4,335,503 | 6/1982 | Evans et al. | 29/572 |
| 4,428,110 | 1/1984 | Kim | 29/572 |
| 4,443,651 | 4/1984 | Swartz | 136/249 MS |

FOREIGN PATENT DOCUMENTS 2624926 12/1977 Fed. Rep. of Germany ...... 136/249 MS

Primary Examiner—Aaron Weisstuch
Attorney, Agent, or Firm—B. E. Morris; D. S. Cohen; W. J. Burke

[57] ABSTRACT

A photovoltaic array comprises a continuous semiconductor body with a plurality of spaced apart first and second electrical contacts on respective opposed surfaces of the body, thereby forming a plurality of photovoltaic cells with the cells series-connected to provide a higher output voltage. The invention is a series-connected array wherein the series connection between a pair of adjacent photovoltaic cells comprises a plurality of openings extending through the semiconductor body with an electrical contact of one cell extending into the plurality of openings to provide a connection with an opposed electrical contact of the next adjacent cell.

14 Claims, 4 Drawing Figures

SERIES-CONNECTED PHOTOVOLTAIC ARRAY AND METHOD OF MAKING SAME

The invention relates to a photovoltaic array having improved series connections between individual photovoltaic cells of the array and a method of making these connections.

BACKGROUND OF THE INVENTION

Photovoltaic cells produce useful electrical energy by the absorption of incident radiation and the generation of electrons and holes. The subsequent separation of the electrons and holes in a built-in electric field, produced for example by a P-N junction, results in the generation of a photovoltage and a photocurrent in an external circuit. The output voltage of a photovoltaic cell is limited by the incident radiation intensity and the materials comprising the cell to some maximum value, typically between 50 and 60 percent of the smallest bandgap energy of the semiconductor materials comprising the cell. With a larger cell area the output current increases but not the output voltage. To increase the output voltage, a plurality of these cells have been electrically connected in series, forming a photovoltaic array.

Photovoltaic cells composed of materials such as amorphous silicon, as described by Carlson in U.S. Pat. No. 4,064,521, incorporated herein by reference, are used in series-connected arrays since they can be fabricated as thin layers. The deposited layers are sub-divided into a plurality of cells as disclosed, for example, by Hanak in U.S. Pat. No. 4,316,049, incorporated herein by reference, using well-known techniques such as photolithography and chemical etching, mechanical scribing or by laser scribing as disclosed by Hanak in U.S. Pat. No. 4,292,092, incorporated herein by reference. Laser scribing of the deposited layers is presently preferred because of its cleanliness and manufacturing flexibility.

In the prior art the fabrication of a thin layer photovoltaic array included the steps of depositing isolated conducting segments on an insulating substrate, depositing a semiconductor body having a rectifying junction over the segmented conducting layer and the channels therebetween, and forming a continuous, linear opening through the body close to and parallel to an edge of each segment. An electrical contact layer is then deposited over the semiconductor body and on the conducting segments in the openings in the semiconductor body. The contact layer is then sub-divided by means of grooves adjacent to the linear opening in the semiconductor body.

These series connections, while simple and useful in mass production, are often not sufficiently conducting. The underlying segment is also sometimes severely damaged by the scribing process which markedly increases the series resistance. If the segment is completely severed the series contact is lost and the array is useless.

Alternatively, if the openings in the semiconductor body and the contact layer are formed simultaneously, only one side of the scribe line may contribute to the electrical connection between the layer and a segment. The other side of the scribe line is prevented from acting as an electrical contact because the metal electrode is severed.

It is desirable to have an interconnection scheme which maintains the advantages of the prior art methods but which improves the contact between adjacent cells.

SUMMARY OF THE INVENTION

A photovoltaic array comprises a plurality of photovoltaic cells, each cell including an electrically conducting segment, a semiconductor body overlying the segment and an electrically conducting region overlying the semiconductor body. The series connection between the conducting segment of a cell and the conducting region of an adjacent cell comprises a plurality of openings extending through the semiconductor body over the segment with the conducting region of the adjacent cell extending into the plurality of openings.

DETAILED DESCRIPTION OF PREFERRED EMBODIMENTS

Figure 1:
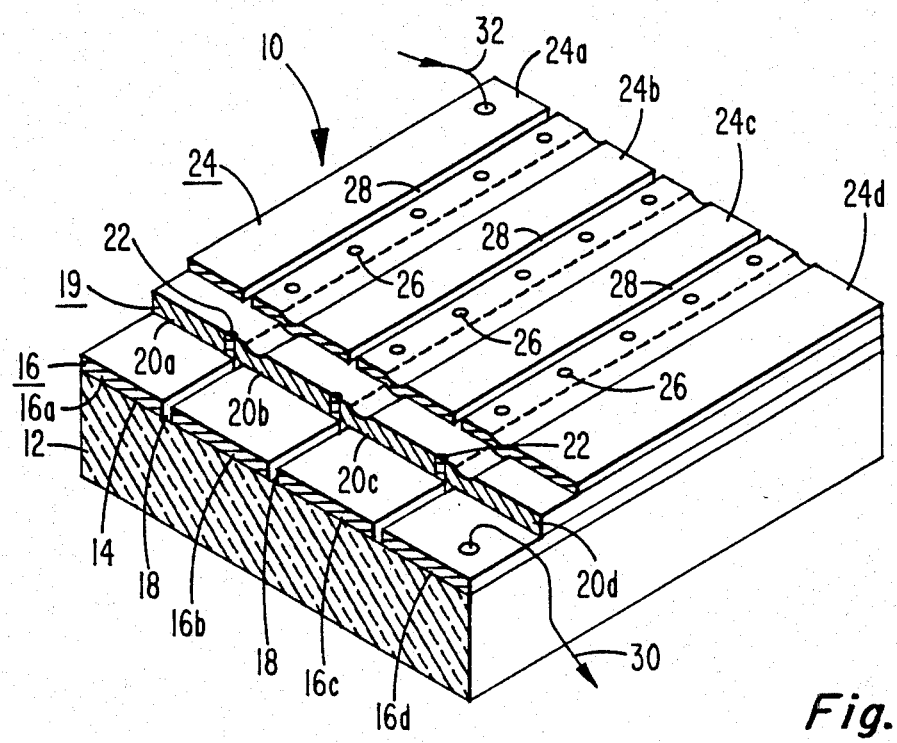
FIG. 1 is a perspective view, cut away, of a photovoltaic array of the invention.

In FIG. 1 the photovoltaic array 10 includes a substrate 12 having a surface 14 and a plurality of electrically conducting segments 16, shown as segments 16(a), 16(b), 16(c) and 16(d), separated by continuous channels 18 overlying the surface 14. A layer of semiconductor material 19 comprising the semiconductor bodies 20(a), 20(b), 20(c) and 20(d) overlies the segments 16(a), 16(b), 16(c) and 16(d) respectively, fills the channels 18 and has a plurality of openings 22 therethrough over each of the segments 16. A plurality of electrically conducting regions 24(a), 24(b), 24(c) and 24(d) overlie the semiconductor layer 19 and extend into the openings 22 down to the surfaces of the segments 16, leaving indentations 26 in the conducting layer 24. Continuous grooves 28 separate the electrically conducting regions 24. The extension of the electrically conducting regions 24 into the openings 22 provides the series electrical contact between a particular conducting region, for example region 24(c), and segment 16(b) of the adjacent cell. In this way the series interconnection of individual photovoltaic cells, each cell comprising a segment 16, an overlying conducting region 24 and the semiconductor body 20 therebetween, is provided.

The substrate 12 may be composed of a material such as glass if light is to enter the array through the substrate or any other material which has a thickness and mechanical strength sufficient to support the remainder of the structure and which is electrically insulating. Alternatively, the substrate may include a portion adjacent to the surface 14 which is electrically insulating.

The segments 16 may be composed of a light-transmissive material, such as tin or indium conductive oxide, if light is to enter the body 20 through the segments 16. Alternatively, this material may be a metal which preferably does not diffuse into the overlying semiconductor layer 19 during subsequent fabrication steps or during actual operation. The segments 16 may be deposited by evaporation or spraying techniques using either a mask or a subsequent scribing step to define the individual segments. Alternatively, a screening process may be used.

The layer 19 comprises one or more light-sensitive semiconductor materials such as amorphous silicon containing hydrogen or other defect-compensating elements. This material is typically deposited using a glow discharge in monosilane together with appropriate conductivity modifiers, as disclosed by Carlson in U.S. Pat. No. 4,064,521. Typically, the layer 19 comprises a P-type layer about 10 namometers (nm) thick overlying the segments 16 and the surface 14 therebetween, a substantially intrinsic conductivity type layer between 400 and 600 nm thick overlying the P-type layer and an N-type layer about 15 nm thick overlying the intrinsic layer, thereby forming a P-I-N photovoltaic semiconductor body having a rectifying junction therein. Alternatively, a layer 19 incorporating a P-N junction or a Schottky barrier as the rectifying junction may be used.

The openings 22 are typically arranged along a line parallel to the segment edge over a portion of the segment adjacent to the segment edge. The openings 22 are preferably spaced apart from one another along this line but may overlap one another so long as the semiconductor material is not completely severed.

The electrically conducting regions 24 are composed of one or more metallic layers. Typically, a thin layer of titanium overlies an amorphous silicon body and serves as a diffusion barrier for a thicker, overlying aluminum layer. Typically, the titanium layer is between 2 and 5 nm thick but can be greater. The aluminum layer is typically between 200 and 800 nm thick.

A cw argon ion laser or a pulsed Nd:YAG laser can be used to form the openings in both the semiconductor body and the overlying electrically conducting layers.

The array 10 differs from prior-art photovoltaic arrays in that each of the series interconnections between adjacent cells comprises a plurality of openings 22 rather than a single, continuous opening which severs the semiconductor layer 19. The relative advantage of the plurality of openings 22 over a single, continuous opening depends upon the sequence of steps used to fabricate the array 10.

Figure 2A:
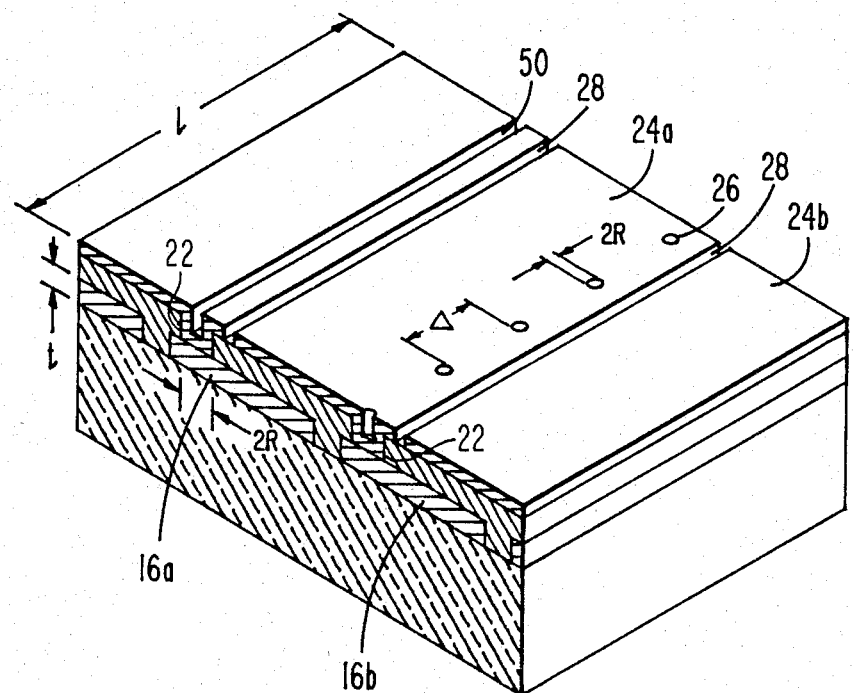

A first approach to fabrication of the array 10 is to form the opening or openings 22 in the semiconductor layer 19 prior to the deposition of the electrically conducting regions 24. If the opening or openings 22 extend through the layer 19 and the segments 16 are not damaged in this process, then the total contact area of the subsequently deposited conducting layer to a segment will, in general, be greater with a single, continuous opening than with the plurality of openings 22. As can be seen from FIG. 2(a), the total contact area to the segment 16(a) for a single, continuous opening 50 of the length L and width 2R is $A_L = 2LR$ while for a plurality of circular openings 22 whose total number is $L/(2R+\Delta)$, where 2R is the diameter of an opening, $\Delta$ is the spacing between openings and L is the total distance between the end openings, the total contact area is $A_c = \pi L R^2/(2R+\Delta)$. Comparison of these calculated contact areas shows that the contact area for the plurality of circular openings 22 is less than that for the single opening 50 in this case.

Figure 2B:
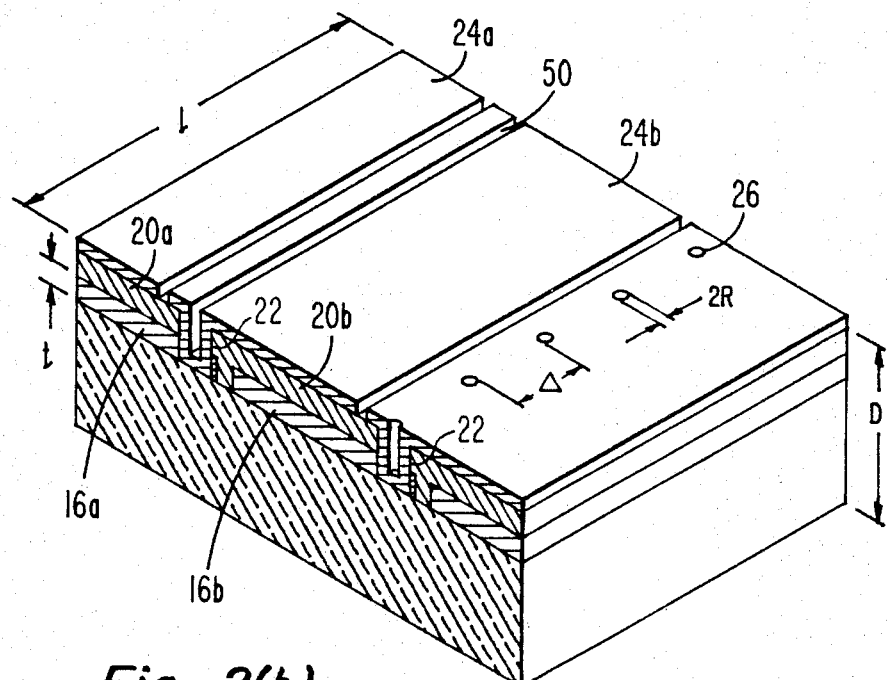

In FIG. 2(b) the segments 16(a) and 16(b) are shown as severed by the scribing process used to form the openings 22. The severing of the segments can occur accidentally during the scribing process due, for example, to the use of excessive laser power during a laser scribing step or due to a non-uniform total thickness of the array during a mechanical scribing step. The contact area at a segment 16a for a single, continuous opening of length L is $A_L = Lt$ where t is the thickness of the exposed sidewall of the segment as shown in FIG. 2(b). The contact area for a plurality of circular openings is $A_c = \pi L t/(1+\Delta/2R)$. Comparison of these calculated contact areas shows that a plurality of circular openings 22 will provide a greater contact area to a segment than a single opening 50 up to a spacing between the openings of about 4R.

A second approach to the fabrication of the array 10 is to deposit a conducting layer on the layer 19 prior to the formation of the openings 22. A laser scriber is then used to punch through both the conducting layer and the layer 19 with molten metal produced during the scribing process flowing down into the openings 22 to form the connection to the underlying segment 16. This approach is preferred since all the layers are deposited prior to the scribing step. In general, the flowing metal does not completely cover the exposed surface of a segment 16 in the bottom of an opening 22.

Figure 3:
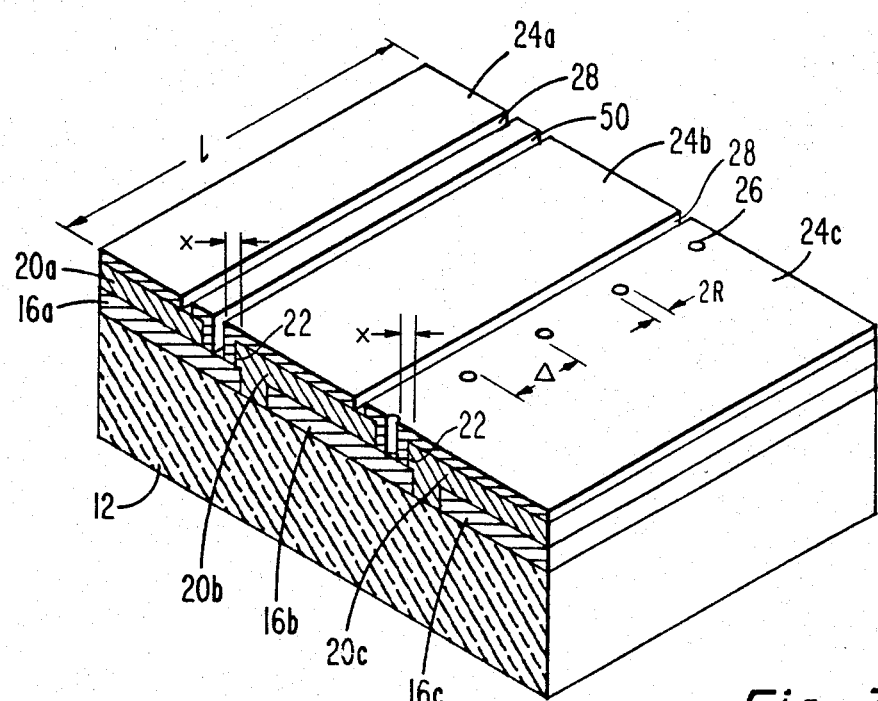
FIGS. 2(a), 2(b) and 3 are perspective views, cut away, of a portion of a photovoltaic array illustrating different series connections between adjacent cells.

If the flowing metal extends a distance x over the surface of a segment from the wall of an opening as shown in FIG. 3, then for a single, continuous opening 50 of the length L the contact area is $A_L = Lx$ while for a plurality of circular openings 22 the contact area is $A_c = \pi L x/(1+\Delta/2R)$. The plurality of circular openings 22 then provides a larger contact area at the segment 16(b). For $\Delta \cong R$ the total amount of metal available to flow into the opening is about the same for the two cases. If the formation of the openings using the second approach results in the severing of the segments, as shown in FIG. 2(b), the result would be the same as above for the plurality of openings. However, for the continuous opening there would be no contact at all between adjacent cells if the conducting segment is severed.

The principles of the invention are illustrated by the following Example, but are not limited to the details described therein.

EXAMPLE

Four monolithic series-connected photovoltaic arrays were formed on glass substrates 7.6 centimeters (cm) square. Each array comprised 13 cells, each 0.5 cm in width and 6.5 cm in length, with the interconnections between cells along the length of the cells. The segments were composed of conducting tin oxide about 500 nm thick deposited by evaporation techniques, with the individual segments defined by laser scribed channels formed using a pulsed Nd:YAG laser. An amorphous silicon P-I-N body having a total thickness of about 500 nm was then deposited over the conducting segments and the surface of the substrate in the channels by glow discharge.

The four arrays, labeled A through D, are listed in the Table together with the distinguishing characteristics and resulting resistance per cm of interconnect length. In each case the aluminum metallization was preceded by the sputter deposition of 26 nm of titanium.

TABLE

| Array | Opening Sequence | Opening Type | Al Thickness (nm) | Interconnect Resistance (ohm/cm) |
|---|---|---|---|---|
| A | before contact metallization | continuous | 280 | 3.2 |
| B | before contact | overlapping circles | 280 | 1.0 |

TABLE-continued

| Array | Opening Sequence | Opening Type | Al Thickness (nm) | Interconnect Resistance (ohm/cm) |
|---|---|---|---|---|
| C | metallization after contact metallization | overlapping circles | 280 | 52.1 |
| D | metallization after contact metallization | spaced circles | 630 | 6.1 |

For the array A continuous openings in the amorphous silicon body were formed by laser scribing with a cw argon ion laser. The titanium and aluminum layers were then deposited on the silicon layer and in the openings. For the array B circular openings which just overlapped and which extended completely through the silicon only at the center of the circles were formed prior to the deposition of the metal contact layer. For array C the metal contact layer was deposited prior to the formation of overlapping circular openings through both the layers. For array D circular openings $5 \times 10^{-3}$ cm in diameter on $7 \times 10^{-3}$ cm center-to-center spacings ($\Delta = 2 \times 10^{-3}$ cm) were formed.

These results show that the contact resistance of array B is less than that of array A, which used the method of the prior art. This lesser resistance is probably due to lesser damage to the segments during the scribing process and to a greater layer peripheral contact area. The interconnect resistance for array D is only a factor two worse than that of array A. This is an excellent result, with much lower contact resistance expected for thicker metallization. In addition, comparison of arrays C and D shows that the spaced, circular openings provide a much reduced contact resistance compared to overlapping openings. We believe this is due to the fact that the metallization between the openings is destroyed when the openings overlap.

We claim:

1. In a photovoltaic array comprising a plurality of series-connected photovoltaic cells, comprising a plurality of spaced apart electrically conducting segments, a continuous semiconductor body with a rectifying junction therein overlying said segments and a corresponding plurality of spaced apart electrically conducting regions overlying the body in opposing relation to said plurality of conducting segments, each cell comprising a conducting segment, the overlaying portion of the semiconductor body, and the corresponding conducting region;
   the improvement wherein the series connection between a first photovoltaic cell and an adjacent photovoltaic cell comprises a plurality of separate openings through the semiconductor body of the first cell with the conducting region of the adjacent cell extending into the openings and contacting the conducting segment of the first cell.

2. The array of claim 1 wherein the plurality of openings are positioned over a portion of said segment adjacent to a segment edge.

3. The array of claim 2 wherein the plurality of openings are positioned in a line parallel to the segment edge.

4. The array of claim 3 wherein the plurality of openings overlap one another along said line.

5. The array of claim 3 wherein the plurality of openings are spatially separated from one another.

6. The array of claim 5 wherein adjacent openings are spatially separated a distance less than or equal to 4 times the radius of the openings.

7. The array of claim 3 wherein the semiconductor body includes amorphous silicon and comprises a layer of first conductivity type overlying the segments, an intrinsic conductivity type layer overlying the layer of first conductivity and a layer of second conductivity type overlying the layer of intrinsic conductivity type.

8. The array of claim 7 wherein the segments are light-transmissive.

9. The array of claim 3 wherein the openings extend into the conducting segment.

10. A method of fabricating a photovoltaic array which includes a plurality of series connected photovoltaic cells, which method comprises the steps of:
    forming a plurality of spaced apart electrically conducting segments on a substrate;
    forming a continuous semiconductor body having a rectifying junction therein over each segment;
    forming an electrically conducting region on the surface of the semiconductor body overlying each segment with the conducting region of a first cell extending into a plurality of separate openings in the semiconductor body of an adjacent cell and electrically contacting the conducting segment of an adjacent cell.

11. The method of claim 10 wherein the plurality of openings in the semiconductor body of a cell are formed prior to the step of forming the electrically conducting regions.

12. The method of claim 10 wherein the plurality of openings in the semiconductor body of a cell are formed after the step of forming the electrically conducting regions.

13. The method of claim 12 further comprising the step of electrically isolating the electrically conducting regions from one another after the step of forming the openings in the semiconductor body.

14. The method of claim 12 further comprising the step of electrically isolating the electrically conducting regions from one another prior to the step of forming the openings in the semiconductor body.

* * * * *